(12) United States Patent
Lv et al.

(10) Patent No.: US 11,244,821 B2
(45) Date of Patent: Feb. 8, 2022

(54) METHOD FOR PREPARING ISOLATION AREA OF GALLIUM OXIDE DEVICE

(71) Applicant: THE 13TH RESEARCH INSTITUTE OF CHINA ELECTRONICS TECHNOLOGY GROUP CORPORATION, Shijiazhuang (CN)

(72) Inventors: Yuanjie Lv, Shijiazhuang (CN); Yuangang Wang, Shijiazhuang (CN); Xingye Zhou, Shijiazhuang (CN); Xin Tan, Shijiazhuang (CN); Xubo Song, Shijiazhuang (CN); Shixiong Liang, Shijiazhuang (CN); Zhihong Feng, Shijiazhuang (CN)

(73) Assignee: The 13th Research Institute of China Electronics Technology Group Corporation, Shijiazhuang (CN)

( * ) Notice: Subject to any disclaimer, the term of this patent is extended or adjusted under 35 U.S.C. 154(b) by 0 days.

(21) Appl. No.: 17/036,126

(22) Filed: Sep. 29, 2020

(65) Prior Publication Data

US 2021/0013027 A1 Jan. 14, 2021

Related U.S. Application Data

(63) Continuation of application No. PCT/CN2018/121423, filed on Dec. 17, 2018.

(30) Foreign Application Priority Data

Nov. 30, 2018 (CN) .......................... 201811450087.7

(51) Int. Cl.
*H01L 21/00* (2006.01)
*H01L 21/02* (2006.01)
(Continued)

(52) U.S. Cl.
CPC .... *H01L 21/0223* (2013.01); *H01L 21/02233* (2013.01); *H01L 21/02255* (2013.01); *H01L 21/47573* (2013.01); *H01L 21/762* (2013.01)

(58) Field of Classification Search
None
See application file for complete search history.

(56) References Cited

U.S. PATENT DOCUMENTS

| 2003/0207591 | A1* | 11/2003 | Lu ..................... H01L 21/76224 438/770 |
| 2005/0130378 | A1* | 6/2005 | Huang .............. H01L 21/76229 438/296 |

(Continued)

FOREIGN PATENT DOCUMENTS

| CN | 1770406 A | 5/2006 |
| CN | 101207063 A | 6/2008 |

(Continued)

*Primary Examiner* — Reema Patel
(74) *Attorney, Agent, or Firm* — Slater Matsil, LLP

(57) ABSTRACT

The present disclosure discloses a method for preparing an isolation area of a gallium oxide device, the method comprising: depositing a mask layer on a gallium oxide material; removing a preset portion region of the mask layer; preparing an isolation area in a position, corresponding to the preset portion region, on the gallium oxide material by using a high-temperature oxidation technique, with the isolation area being located between active areas of the gallium oxide device; and removing the remaining mask layer on the gallium oxide material. In the disclosure, the isolation area is prepared by using the high-temperature oxidation technique, which prevents damage to the gallium oxide device during the preparation of the isolation area, thereby achieving isolation between the active areas of the gallium oxide device.

10 Claims, 3 Drawing Sheets

(51) Int. Cl.
*H01L 21/4757* (2006.01)
*H01L 21/762* (2006.01)

(56) References Cited

U.S. PATENT DOCUMENTS

| | | | |
|---|---|---|---|
| 2007/0290264 A1* | 12/2007 | Sugii | H01L 29/78654 257/348 |
| 2014/0367787 A1* | 12/2014 | Vakada | H01L 27/092 257/369 |
| 2016/0042949 A1 | 2/2016 | Sasaki et al. | |

FOREIGN PATENT DOCUMENTS

| | | |
|---|---|---|
| CN | 107464844 A | 12/2017 |
| CN | 108615769 A | 10/2018 |

* cited by examiner

METHOD FOR PREPARING ISOLATION AREA OF GALLIUM OXIDE DEVICE

CROSS-REFERENCE TO RELATED APPLICATIONS

This application is a continuation application of International Application No. PCT/CN2018/121423, filed on Dec. 17, 2018, which claims priority to Chinese Patent Application No. CN201811450087.7, filed on Nov. 30, 2018. The disclosures of the aforementioned applications are hereby incorporated herein by reference in their entireties.

TECHNICAL FIELD

The disclosure relates to the technical field of semiconductor manufacturing, in particular to a method for preparing an isolation area of a gallium oxide device.

BACKGROUND

Gallium oxide devices typically have isolation between active areas by preparing isolation area. The existing method for preparing the isolation area is generally realized by adopting a trench etching technology, but the etching power is high when the gallium oxide device is etched by the trench etching technology, and the etching rate is high, thereby the gallium oxide device is subjected to etching damage, and the edge of the active areas are easy to break down.

SUMMARY OF THE INVENTION

These and other problems are generally solved or circumvented, and technical advantages are generally achieved, by embodiments of the present disclosure which provide a method for preparing an isolation area of a gallium oxide device.

Technical Problem

The embodiment of the disclosure provides a method for preparing an isolation area of a gallium oxide device, aiming at solving the problem that the gallium oxide device is damaged in the preparation process of the isolation area in the prior art.

Technical Solution

Embodiments of the disclosure provide a method for preparing an isolation area of a gallium oxide device, the method comprising: depositing a mask layer on a gallium oxide material; removing a preset portion region of the mask layer; preparing an isolation area in a position, corresponding to the preset portion region, on the gallium oxide material by using a high-temperature oxidation technique, with the isolation area being located between active areas of the gallium oxide device; and removing the remaining mask layer on the gallium oxide material.

In one embodiment, the high-temperature oxidation technique comprises: performing a high-temperature annealing in an oxygen atmosphere, and an annealing temperature of the high-temperature annealing is greater than or equal to 300° C., and an annealing time of the high-temperature annealing is greater than or equal to 30 s.

In one embodiment, one or more isolation areas are prepared on the gallium oxide material, and the number of isolation areas is greater than or equal to 1.

In one embodiment, the isolation areas are the same in depth.

In one embodiment, the isolation areas are different in depth.

In one embodiment, after removing the preset portion region of the mask layer, the method further comprising: shallow etching the isolation area on the gallium oxide material.

In one embodiment, the depth of the shallow etching is 100 nm or less.

In one embodiment, the mask layer is formed of a metal, insulating medium, or semiconductor material.

In one embodiment, removing the preset portion region of the mask layer comprises: removing the preset portion region of the mask layer by photoetching, developing and dry etching.

In one embodiment, removing the preset portion region of the mask layer comprises: removing the preset portion region of the mask layer by photoetching, developing and wet etching.

Advantageous Effects of the Disclosure

Compared with the prior art, the embodiment of the disclosure has the beneficial effects that: in the disclosure, the isolation area is prepared by using the high-temperature oxidation technique, which prevents damage to the gallium oxide device during the preparation of the isolation area, thereby achieving isolation between the active areas of the gallium oxide device.

The foregoing has outlined rather broadly the features and technical advantages of the present disclosure in order that the detailed description of the disclosure that follows may be better understood. Additional features and advantages of the disclosure will be described hereinafter which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

In order to explain the technical solutions in the embodiments of the disclosure more clearly, the following will briefly introduce the drawings that need to be used in the embodiments. Obviously, the drawings in the following description are only some embodiments of the disclosure, for those of ordinary skill in the art, other drawings can be obtained based on these drawings without creative labor.

Therein: 1. gallium oxide material; 2. mask layer; 3. isolation area.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the embodiments of this disclosure are discussed in detail below. It should be appreciated, however, that the concepts disclosed herein can be embodied in a wide variety of specific contexts. The specific embodiments discussed are merely illustrative, and do not limit the scope of the claims.

For those skilled in the art to better understand the technical scheme, the technical scheme in the embodiments of the disclosure will be clearly described below in conjunction with the drawings in the embodiments of the disclosure. Obviously, the described embodiments are part of the scheme, rather than all the embodiments. Based on the embodiments of the disclosure, all other embodiments obtained by a person of ordinary skill in the art without involving any inventive effort are within the scope of the disclosure.

The term "comprising" and any variations thereof in the description and claims of the disclosure and in the above-mentioned figures means "including, but not limited to", and is intended to cover a non-exclusive inclusion.

Implementations of the disclosure are described in detail below with reference to specific drawings.

Figure 1:
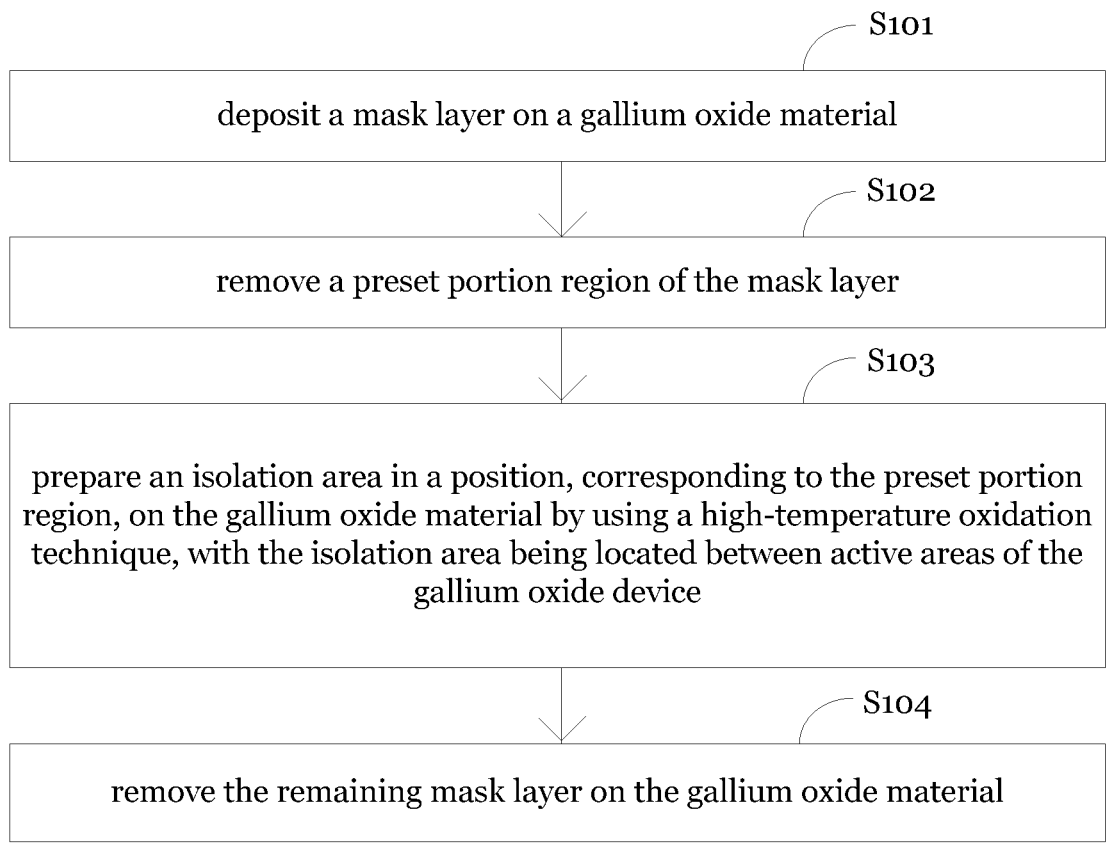
FIG. 1 is a schematic flow diagram of a method for preparing an isolation area of a gallium oxide device in accordance with one embodiment of the disclosure.
Figure 2:
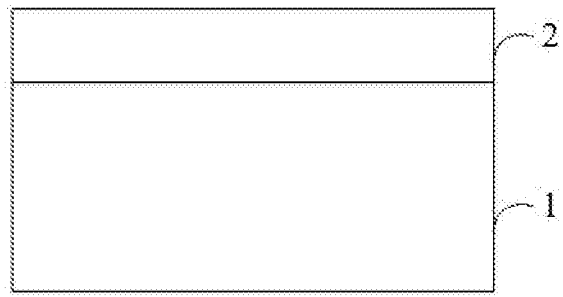
FIG. 2 is a schematic view of a structure for generating a mask layer when one isolation area is provided in accordance with one embodiment of the disclosure.
Figure 3:
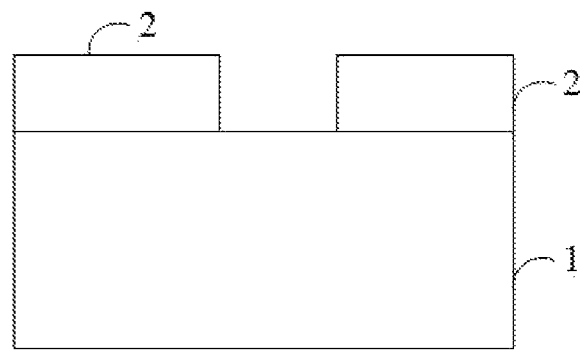
FIG. 3 is a schematic view of a structure for removing a preset portion region when one isolation area is provided in accordance with one embodiment of the disclosure.
Figure 4:
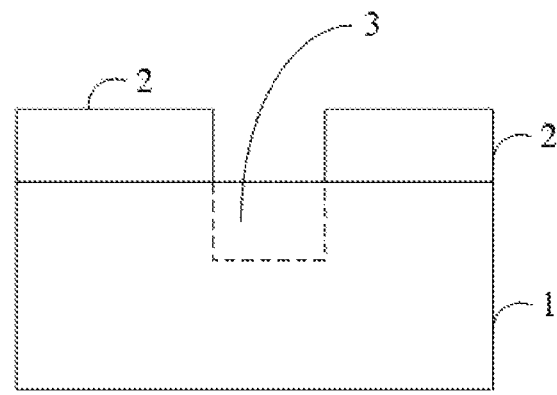
FIG. 4 is a schematic view of a structure for preparing an isolation area when one isolation area is provided in accordance with one embodiment of the disclosure.
Figure 5:
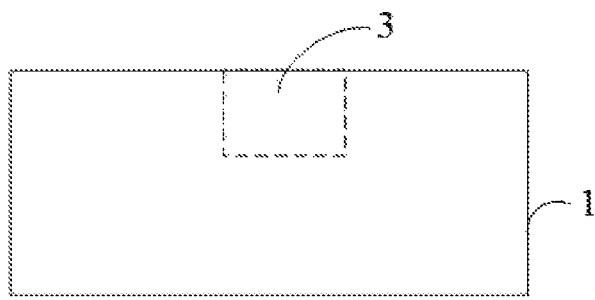
FIG. 5 is a schematic view of a structure for removing the remaining mask layer when one isolation area is provided in accordance with one embodiment of the disclosure.
Figure 6:
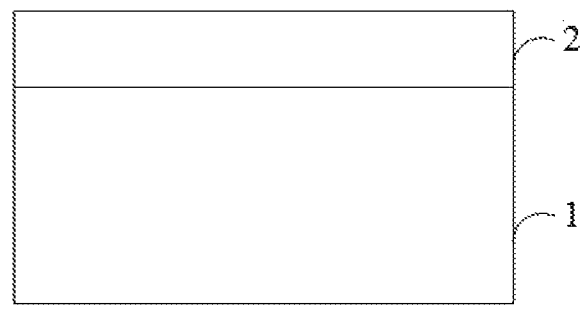
FIG. 6 is a schematic view of a structure for generating a mask layer when two isolation areas are provided in accordance with one embodiment of the disclosure.
Figure 7:
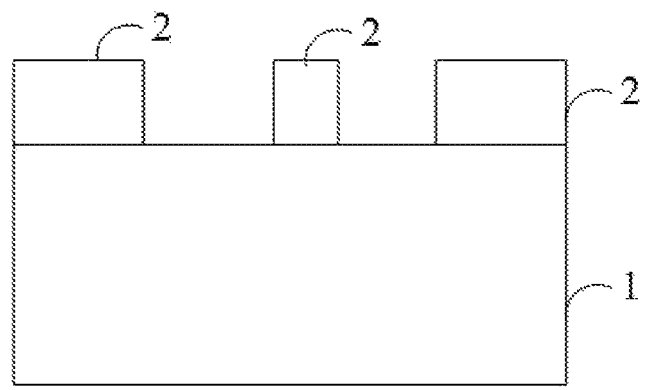
FIG. 7 is a schematic view of a structure for removing two preset portion regions when two isolation areas are provided in accordance with one embodiment of the disclosure.
Figure 8:
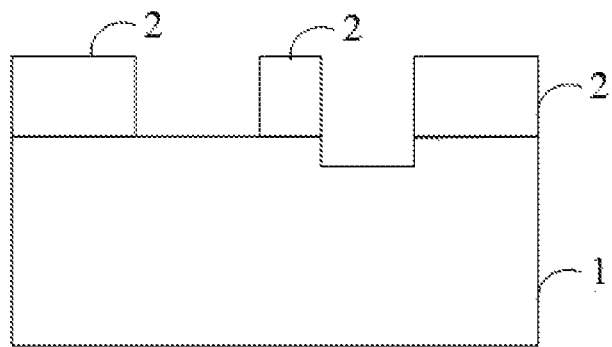
FIG. 8 is a schematic view of a structure for shallow etching an isolation area when two isolation areas are provided in accordance with one embodiment of the disclosure.
Figure 9:
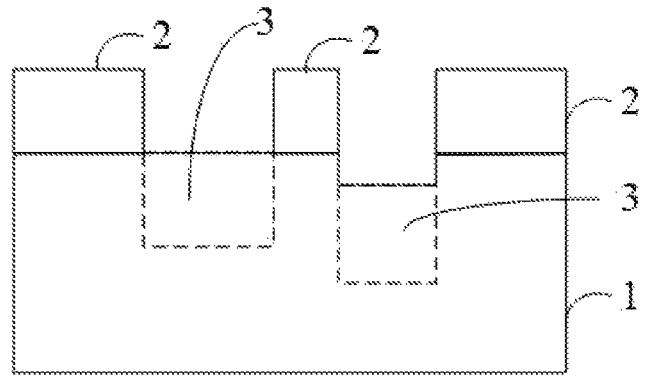
FIG. 9 is a schematic view of a structure for preparing isolation areas when two isolation areas are provided in accordance with one embodiment of the disclosure.
Figure 10:
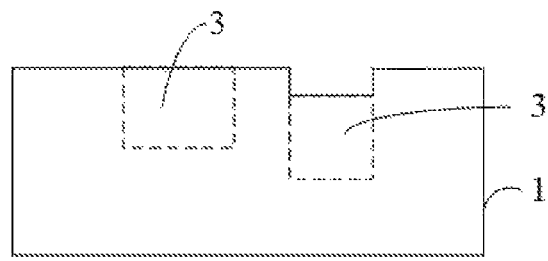
FIG. 10 is a schematic view of a structure for removing the remaining mask layer when two isolation areas are provided in accordance with one embodiment of the disclosure.

FIG. 1 illustrates a method for preparing an isolation area of a gallium oxide device provided by embodiments of the disclosure, for ease of illustration, only those portions relevant to embodiments of the disclosure have been shown and described in detail below.

As shown in FIG. 1, the method for preparing an isolation area of a gallium oxide device provided by the embodiment of the disclosure comprises the following steps.

At step S101, deposit a mask layer on a gallium oxide material.

At step S102, remove a preset portion region of the mask layer.

At step S103, prepare an isolation area in a position, corresponding to the preset portion region, on the gallium oxide material by using a high-temperature oxidation technique, with the isolation area being located between active areas of the gallium oxide device.

At step S104, remove the remaining mask layer on the gallium oxide material.

In the embodiment, the preset portion region corresponds to the part of the gallium oxide material which needs to be provided with the isolation area, and the preset portion region may be one or multiple, and the number of the preset portion region are determined according to the number of the isolation area.

In this embodiment, the isolation area is non-electron isolation area.

In the embodiment of the disclosure, the isolation area is prepared by using the high-temperature oxidation technique, which prevents damage to the gallium oxide device during the preparation of the isolation area, and improves the breakdown voltage of the gallium oxide device, thereby achieving isolation between the active areas of the gallium oxide device.

In one embodiment of the disclosure, the mask layer is prepared by MOCVD, PECVD, LPCVD, MBE, electrode metal autoxidation, or a combination of multiple methods.

In one embodiment of the disclosure, the high-temperature oxidation technique comprises: performing a high-temperature annealing in an oxygen atmosphere, and an annealing temperature of the high-temperature annealing is greater than or equal to 300° C., and an annealing time of the high-temperature annealing is greater than or equal to 30 s.

In one embodiment of the disclosure, one or more isolation areas are prepared on the gallium oxide material, and the number of isolation areas is greater than or equal to 1.

In the embodiment, the isolation area comprises several sub-regions.

In the embodiment, the number of the isolation area may be one or more.

In one embodiment of the disclosure, the isolation areas are the same in depth.

In the embodiment, several sub-regions of the isolation area are the same in depth.

In one embodiment of the disclosure, the isolation areas are different in depth.

In the embodiment, several sub-regions of the isolation area are different in depth.

In one embodiment of the disclosure, after step S102, the method further comprises: shallow etching the isolation area on the gallium oxide material.

In the embodiment, the shape of the isolation area is etched out in advance through shallow etching, so that the performance of the gallium oxide device is not influenced, and preparation is made for preparing the isolation areas through later high-temperature oxidation.

In one embodiment of the disclosure, the depth of the shallow etching is 100 nm or less.

In one embodiment of the disclosure, the mask layer is formed of a metal, insulating medium, or semiconductor material.

In the embodiment, the mask layer is a layer of metal, or a layer of insulating medium, or a semiconductor material, or a combination of multiple layers.

In one embodiment of the disclosure, removing the preset portion region of the mask layer comprises: removing the preset portion region of the mask layer by photoetching, developing and dry etching.

In one embodiment of the disclosure, removing the preset portion region of the mask layer comprises: removing the preset portion region of the mask layer by photoetching, developing and wet etching.

For ease of understanding, several specific applications are described below.

As shown in FIG. 2-FIG. 5, application 1 is described as follows.

Deposit a mask layer 2 on a gallium oxide material 1.

Remove a preset portion region of the mask layer 2, and the number of the preset portion region is one.

Prepare one isolation areas in a position, corresponding to the preset portion region, on the gallium oxide material 1 by using a high-temperature oxidation technique, with the isolation area being located between active areas of the gallium oxide device.

And remove the remaining mask layer 2 on the gallium oxide material 1.

Application 2 is described as follows.

Deposit a mask layer on a gallium oxide material.

Remove preset portion regions of the mask layer, and the number of the preset portion regions is two.

Prepare two isolation areas in a position, corresponding to the preset portion regions, on the gallium oxide material by using a high-temperature oxidation technique, with the isolation areas being located between active areas of the gallium oxide device.

And remove the remaining mask layer on the gallium oxide material.

Application 3 is described as follows.

Deposit a mask layer on a gallium oxide material.

Remove a preset portion region of the mask layer, and the number of the preset portion region is one.

Shallow etch one isolation area on the gallium oxide material, the depth of etching is 50 nm.

Prepare one isolation area in a position, corresponding to the preset portion region, on the gallium oxide material by using a high-temperature oxidation technique, with the isolation area being located between active areas of the gallium oxide device.

And remove the remaining mask layer on the gallium oxide material.

As shown in FIG. 6-FIG. 10, application 4 is described as follows.

Deposit a mask layer 2 on a gallium oxide material 1.

Remove preset portion regions of the mask layer 2, and the number of the preset portions region is two.

Shallow etch one isolation area on the gallium oxide material 1, and the depth of etching is 50 nm.

Prepare two isolation areas 3 in a position, corresponding to the preset portion region, on the gallium oxide material 1 by using a high-temperature oxidation technique, with the isolation areas 3 being located between active areas of the gallium oxide device.

And remove the remaining mask layer 2 on the gallium oxide material 1.

Application 5 is described as follows.

Deposit a mask layer on a gallium oxide material.

Remove preset portion regions of the mask layer, and the number of the preset portion regions is two.

Shallow etch two isolation areas on the gallium oxide material, and the depth of etching is 50 nm.

Preparing two isolation areas in a position, corresponding to the preset portion region, on the gallium oxide material by using a high-temperature oxidation technique, with the isolation areas being located between active areas of the gallium oxide device.

Remove the remaining mask layer on the gallium oxide material.

As described above, the above embodiments are merely illustrative of the technical solutions of the disclosure, not limiting thereof; although the disclosure has been described in detail with reference to the foregoing embodiments, those skilled in the art will appreciate that: the technical solutions of the above-mentioned embodiments can still be modified, or some of the technical features thereof can be equivalently replaced; such modifications and substitutions do not depart from the spirit and scope of the embodiments of the disclosure in its nature.

Although embodiments of the present disclosure have been described in detail, it should be understood that various changes, substitutions and alterations can be made herein without departing from the spirit and scope of the disclosure as defined by the appended claims.

Moreover, the scope of the present disclosure is not intended to be limited to the particular embodiments described here. As one of ordinary skill in the art will readily appreciate from the disclosure of the present disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

What is claimed is:

1. A method for preparing an isolation area of a gallium oxide device, comprising:
   depositing a mask layer on a gallium oxide material;
   removing a preset portion region of the mask layer to expose a portion of the gallium oxide material;
   applying a high-temperature oxidation technique to the portion of the gallium oxide material, wherein as a result of applying the high-temperature oxidation technique to the portion of the gallium oxide material, an upper portion of the gallium oxide material is converted into an isolation area without using an etching process, with the isolation area being located between active areas of the gallium oxide device; and
   removing the remaining mask layer on the gallium oxide material.

2. The method of claim 1, wherein the high-temperature oxidation technique comprises: performing a high-temperature annealing in an oxygen atmosphere, and an annealing temperature of the high-temperature annealing is greater than or equal to 300° C., and an annealing time of the high-temperature annealing is greater than or equal to 30 s.

3. The method of claim 1, wherein one or more isolation areas are prepared on the gallium oxide material, and the number of isolation areas is greater than or equal to 1.

4. The method of claim 3, wherein the isolation areas are the same in depth.

5. The method of claim 3, wherein the isolation areas are different in depth.

6. The method of claim 1, wherein after removing the preset portion region of the mask layer, further comprising:
   shallow etching the isolation area on the gallium oxide material.

7. The method of claim 6, wherein the depth of the shallow etching is 100 nm or less.

8. The method of claim 1, wherein the mask layer is formed of a metal, insulating medium, or semiconductor material.

9. The method of claim 1, wherein removing the preset portion region of the mask layer comprises:
    removing the preset portion region of the mask layer by photoetching, developing and dry etching.

10. The method of claim 1, wherein removing the preset portion region of the mask layer comprises:
    removing the preset portion region of the mask layer by photoetching, developing and wet etching.

\* \* \* \* \*